United States Patent [19]

Klosowiak et al.

[11] Patent Number: 5,276,418
[45] Date of Patent: Jan. 4, 1994

[54] FLEXIBLE SUBSTRATE ELECTRONIC ASSEMBLY

[75] Inventors: Tomasz Klosowiak, Glenview; Sanjar Ghaem, Palatine, both of Ill.

[73] Assignee: Motorola, Inc., Schaumburg, Ill.

[21] Appl. No.: 675,045

[22] Filed: Mar. 25, 1991

Related U.S. Application Data

[63] Continuation of Ser. No. 272,183, Nov. 16, 1988, abandoned.

[51] Int. Cl.⁵ .............................................. H01H 9/02
[52] U.S. Cl. ..................................... 335/202; 361/704
[58] Field of Search ............... 361/332, 380, 395, 392, 361/424; 174/35R; 335/202

[56] References Cited

U.S. PATENT DOCUMENTS

| | | | |
|---|---|---|---|
| 4,388,672 | 6/1983 | Skill . | |
| 4,621,247 | 11/1986 | Happach | 335/202 |
| 4,644,308 | 2/1987 | Guery et al. | 335/202 |
| 4,776,214 | 10/1988 | Moran et al. . | |
| 4,811,165 | 3/1989 | Currier et al. | 361/386 |
| 4,858,071 | 8/1989 | Manabe et al. | 361/399 |
| 4,901,203 | 2/1990 | Kobayashi et al. | 361/395 |
| 4,912,439 | 3/1990 | Nagy et al. | 361/426 |
| 5,018,050 | 5/1991 | Mainishi et al. | 361/386 |
| 5,027,091 | 6/1991 | Lesslie et al. | 335/132 |
| 5,034,856 | 7/1991 | Cook et al. | 361/424 |
| 5,053,634 | 10/1091 | Kakinuma | 335/202 |
| 5,107,404 | 4/1992 | Tam | 361/424 |

FOREIGN PATENT DOCUMENTS 3442803 6/1986 Fed. Rep. of Germany .
1058756 3/1954 France .

OTHER PUBLICATIONS

Sheldahl, "Flexible Circuitry Design Guide" pp. 1-3, 1-5 to 1-7, 5-6, 5-12, 1984.
Sheldahl, "Flexible Circuit Design Guide—Second Edition" pp. 4, 5, 7, 20, 1987?.
Sheldahl, "Membrane Switch Design Guide, Third Edition" pp. 58-60, Jun., 1985.

*Primary Examiner*—Lincoln Donovan
*Attorney, Agent, or Firm*—Phillip H. Melamed; John H. Moore

[57] ABSTRACT

A unitary flexible substrate has three planar areas with components and conductors carried thereon. The substrate is folded to provide a subassembly with a compact packaging factor such that each planar area is in a different parallel plane. Two conductor-carrying projections of the substrate extend from different end portions of the substrate to free distal ends of the projections which are positioned adjacent to each other. The projection conductors, at the projection distal ends, are soldered to each other to provide a more direct, low resistance electrical connection between conductors on the substrate end portions. Heat sink rigidizer plates are attached to each of the three planar substrate portions. One rigidizer plate is thermally and planarly coupled to a metal heat sink cover of a protective housing for the folded subassembly. The other rigidizer plates are planarly bonded to each other to form a unitary support structure for two of the planar substrate portions.

28 Claims, 2 Drawing Sheets

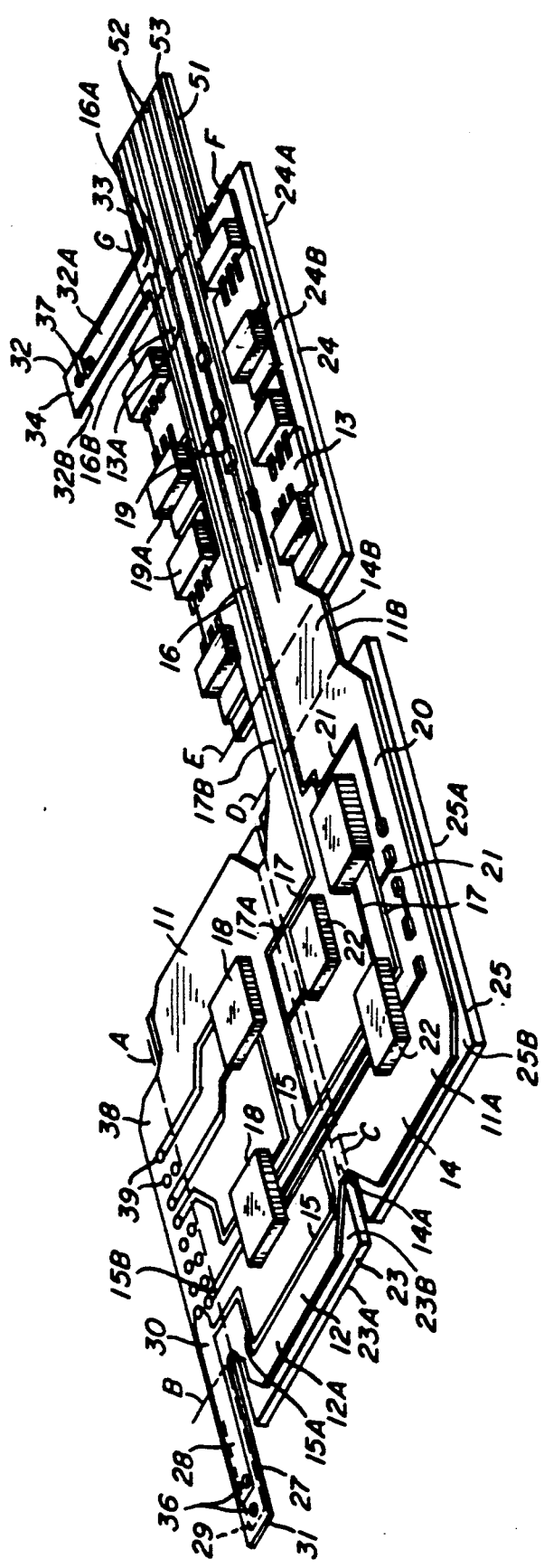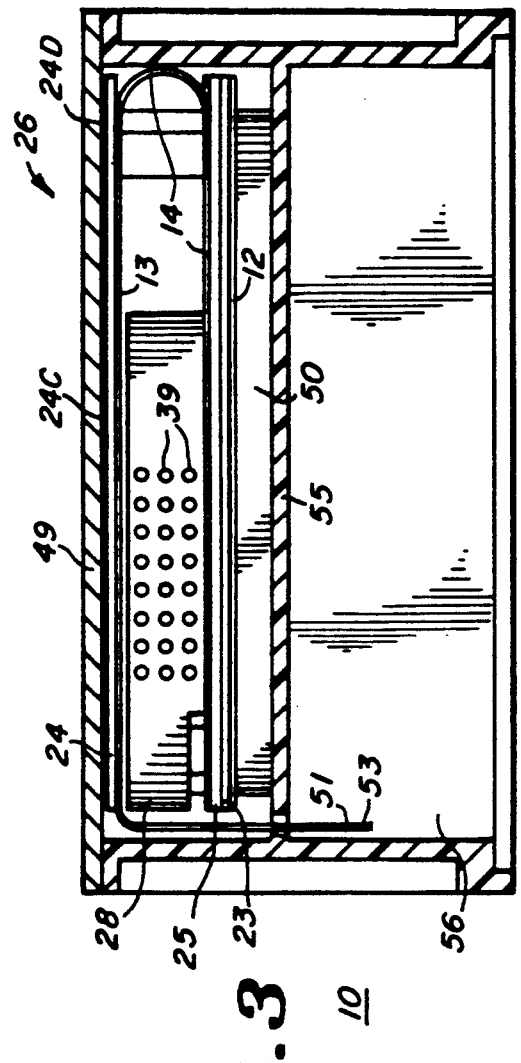

FLEXIBLE SUBSTRATE ELECTRONIC ASSEMBLY

This is a continuation of application Ser. No. 07/272,183, filed Nov. 16, 1988 and now abandoned.

BACKGROUND OF THE INVENTION

The present invention is related to the field of electronic assemblies, and more particularly to such assemblies which utilize flexible printed circuit wiring.

Some prior electronic assemblies use flexible printed wiring as a substrate since it can provide pre-existing flexible interconnections between various non-coplanar portions of a substrate having conductors and components thereon. Some such prior assemblies have utilized an integral flexible substrate having conductors thereon to interconnect three or more different planar portions of the substrate oriented in different planes. Each planar portion can carry a plurality of components. This technique greatly simplifies making interconnections between various portions of the assembly. However, in some situations, an extremely long conductor is required to directly connect a component at one end of the flexible substrate to a component at a distant end of the flexible substrate. If this long conductor is required to have a large current-carrying capacity or a very low resistance, such as the conductor corresponding to a power or ground connection, this complicates the layout of the flexible printed circuit since the long conductor will now have to be relatively wide and still traverse a relatively long distance. This is not desirable since it forces a compromise between efficient circuit layout (space utilization) and the electrical resistance of and/or current-carrying capacity of the desired connection.

In addition to the above-noted disadvantage of prior flexible substrate electronic assemblies, such assemblies typically encounter power dissipation problems for the electronic components mounted thereon by providing insufficient heat sinking configurations for such assemblies while also providing a compact packaging factor. Some prior assemblies heat sink flex circuit boards to a housing. However, such assemblies generally compromise providing optimum heat sinking with providing a compact packaging configuration.

SUMMARY OF THE INVENTION

An object of the present invention is to provide an improved flexible substrate electronic assembly which overcomes one or more of the above-mentioned deficiencies of prior electronic assemblies.

In one embodiment of the present invention, a flexible substrate electronic assembly is provided. The assembly comprises: a flexible insulating substrate having integral first and second portions, said flexible substrate having an integral interim portion extending between and having end portions integral with said first and second substrate portions; first and second pluralities of conductors carried by said first and second substrate portions, respectively, and an interim plurality of conductors carried by said interim substrate portion and providing electrical connections to conductors carried by said first and second substrate portions; wherein the improvement comprises, at least one integral first projection of said flexible substrate, separate from said interim substrate portion, carrying at least one conductor and extending from a proximal end of said first projection integral with said first substrate portion to a free distal end of said first projection, said at least one conductor electrically connected at said proximal end to at least one conductor carried by said first substrate portion at a first end portion thereof and extending to said distal end of said first projection; and electrical connection means, separate from any conductors carried by said first and interim substrate portions, for connecting, at said distal end of said first projection, said at least one conductor carried by said first projection to a conductor carried carried by said second substrate portion at a second end portion thereof.

Essentially, by providing the additional first projection, which extends from the first substrate portion to a free end to be connected to the second substrate portion, a direct low resistance electrical connection can be provided directly between the first and second substrate portions without providing a conductor on the substrate which must traverse the interim substrate portion. This configuration is beneficial when this direct low-resistance connection corresponds to power supply voltage and/or ground connections, between the first and second substrate portions, which connections may be required to have high current-carrying capacity. A relatively wide conductor path can be provided on the first projection and eliminate the need for wide conductor paths on the first, second and interim substrate portions. Thus, greater design flexibility with regard to the layout of conductors on the flexible insulating substrate is provided. First and second pluralities of components are contemplated as being mounted on the first and second substrate portions, and the first projection can provide a low-resistance power supply/ground path therebetween.

According to another aspect of the present invention, rigidizers are provided and associated with the first and second substrate portions. At least one of the rigidizers comprises a thermally conductive plate which is thermally coupled to an external thermally conductive surface of a housing for the electronic assembly. Another of the rigidizers is mounted within the housing and just peripherally supported thereby. This enables the efficient heat sinking of components associated with the substrate portion having the thermally conductive rigidizer plate associated therewith, while providing a compact packaging factor. Preferably, the thermally conductive rigidizer plate is planarly bonded to a planar portion of a thermally conductive metal cover which forms part of the housing.

The above-noted aspects of the present invention, as well as additional aspects and advantages, will become more apparent with reference to the following more-detailed description.

BRIEF DESCRIPTION OF THE DRAWINGS

For a more complete understanding of the present invention, reference should be made to the drawings in which:

FIG. 1 is a perspective view of a flexible substrate having pluralities of conductors and components thereon;

FIG. 3 is a cross-sectional view of the electronic assembly shown in FIG. 2 after full assembly.

DESCRIPTION OF THE PREFERRED EMBODIMENTS OF THE INVENTION

Figure 2:
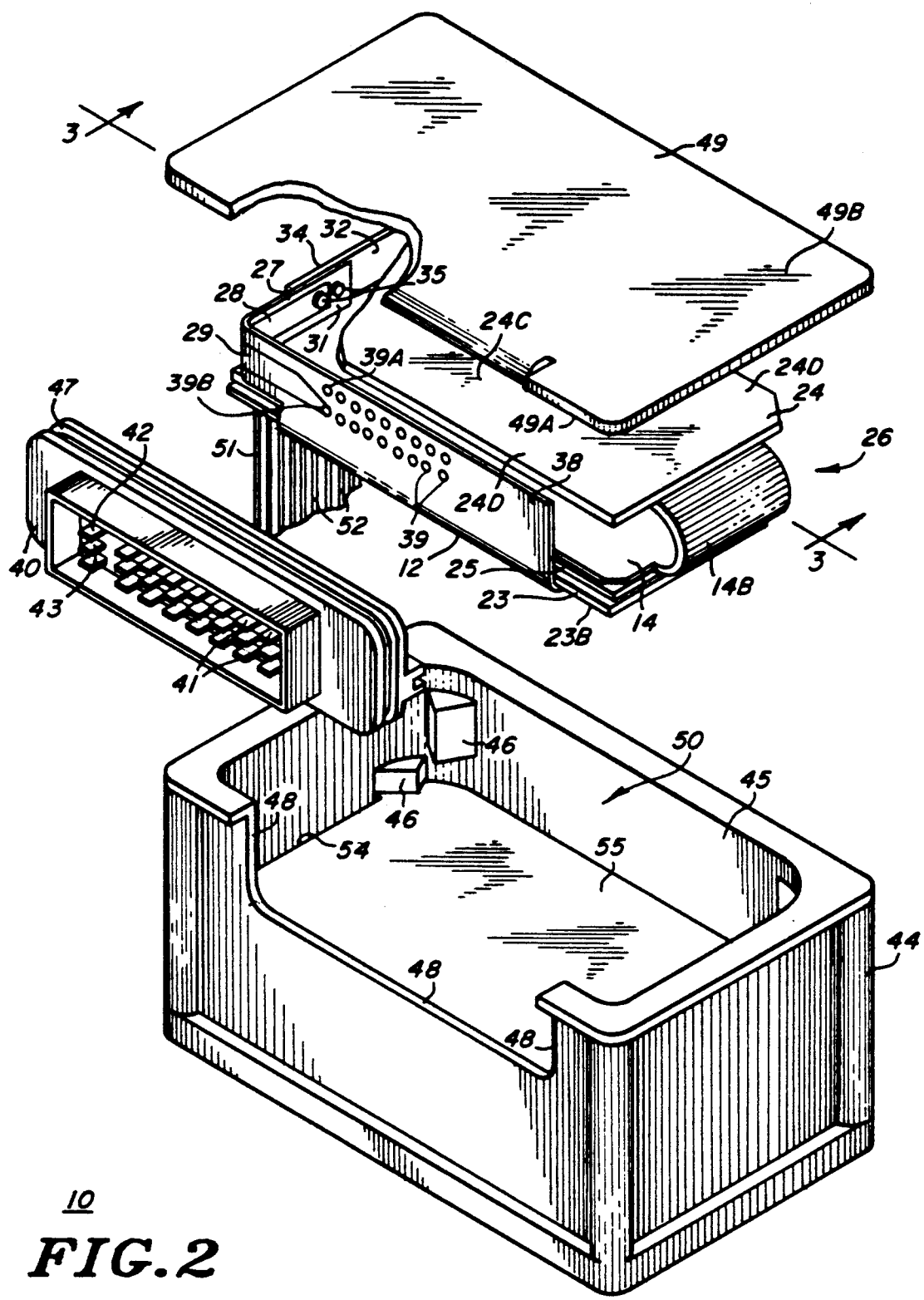
FIG. 2 is an exploded perspective view illustrating how the flexible substrate shown in FIG. 1 is assembled and mounted within a housing to provide an electronic assembly.

Referring to the figures, a flexible substrate electronic assembly 10 is illustrated in exploded perspective view in FIG. 2 and in cross-section in FIG. 3. The assembly includes a unitary flexible insulating substrate 11, best shown in FIG. 1, having components and conductors thereon. The substrate 11 is folded in a desired manner and positioned within a protective housing. The flexible insulating substrate 11 essentially comprises an insulating polyimide film, preferably Kapton, having a large number of conductors, only some of which are shown in FIG. 1, carried by the insulating film. Preferably, the substrate 11 corresponds to a double-sided, flexible printed wiring circuit board with appropriate through-hole connections and with an insulating layer of polyimide covering conductor areas which will not be soldered. This will prevent any accidental shorting by components mounted to the flexible substrate 11.

The flexible substrate 11, illustrated in FIG. 1 prior to folding and assembly into a housing, comprises a planar sheet of insulating material having metal conductors embedded therein with areas of these conductors exposed for connection to components. These components intended for mounting on one side, a top side 11A, of the substrate 11. The substrate 11 includes first and second integral substrate portions 12 and 13. The substrate 11 also includes an integral interim portion 14 extending between the first and second portions 12 and 13. The interim portion 14 has end portions 14A and 14B which are integral with the first and second substrate portions 12 and 13, respectively.

Each of the first and second substrate portions 12 and 13 carry associated first and second pluralities of conductors 15 and 16, respectively. The interim portion 14 also carries an associated interim plurality of conductors 17 which provide electrical connections to the conductors 15 and 16 on the first and second substrate portions 12 and 13. First and second pluralities of electronic components 18 and 19 are associated with and mounted on the first and second substrate portions 12 and 13, respectively. These components are electrically connected to conductors carried by the first and second substrate portions 12 and 13, respectively. The components 18 and 19 are mounted on the top side 11A of the substrate 11 and soldered to exposed areas of conductors carried by the substrate 11. In addition, the interim substrate portion 14 actually includes a third substrate portion 20 which carries a third plurality of conductors 21, comprising conductors 17, and has a third plurality of components 22 associated with and mounted on the third substrate portion 20. End portions 14A and 14B of the interim substrate portion 14 carry conductors 17A and 17B, which are part of the interim plurality of conductors 17 and part of the plurality of conductors 21. The conductors 21 and components 22 on interim substrate portion 14 provide electrical connection between the conductors 15 and components 18 on the first substrate portion 12 and the conductors 16 and components 19 on the second substrate portion 13.

What has been described above represents conventional flexible printed circuit wiring utilized as a flexible component substrate with three different associated substrate areas having components mounted thereon. A problem with such prior assemblies is that providing a direct electrical connection between a conductor at one end portion of substrate portion 12, such as end portion 12A, and a conductor at a distant end portion of substrate portion 13, such as end portion 13A, requires an extremely long conductor. This long conductor may have high resistance and must essentially traverse the entire surface of the substrate portions 12, 13 and 14. In addition, providing such a direct electrical connection complicates the circuit component layout since space must be allocated for running a conductor path on the flexible substrate 11 from substrate end portion 12A, via the interim substrate portion 14, to the substrate end portion 13A. These deficiencies are overcome by a major aspect of the present invention which will be subsequently discussed.

It should be noted that each of the first, second and third substrate portions 12, 13 and 20 have an associated portion of a bottom side 11B of the flexible substrate 11 mounted to planar top surfaces 23B, 24B and 25B of first, second and third rigidizer plates 23, 24 and 25, respectively. These rigidizer plates preferably comprise, thermally conductive metal plates which are bonded to the bottom side 11B of the flexible substrate 11 to prevent flexing of the substrate 11 in areas where components are bonded and to provide support for these bonded components. These plates are added prior to any folding of the flexible substrate to prevent such folding from potentially degrading the bonding of the components to the flexible substrate conductors. Since these plates are metal, and therefore thermally conductive, they provide, by themselves, some heat sinking for the components 18, 19 and 22.

After attachment of the rigidizer plates 23–25, and after the mounting of components to the flexible substrate 11, then the essentially coplanar substrate 11 shown in FIG. 1 will be folded along fold lines A through G shown in FIG. 1 to create a compact folded subassembly 26 best shown in FIGS. 2 and 3. Then this subassembly will be mounted in a protective housing for the flexible substrate assembly 10. After the folding of the flexible substrate 11, it should be noted that each of the first, second and third substrate portions 12, 13 and 20 are essentially substantially planar in orientation but are oriented in different parallel planes as shown in FIGS. 2 and 3. This aids in providing a compact packaging factor for the flexible substrate assembly 10 whereby space utilization within the housing for the flexible substrate assembly 10 is maximized. When the subassembly 26 is folded along the lines A through G, preferably the rigidizer plates 23 and 25 have their bottom planar surfaces 23A and 25A planarly bonded together as shown in FIGS. 2 and 3 either by conductive adhesive, solder or some other bonding material. This provides a unitary support structure, comprising bonded plates 23 and 25, which is easier to mount and support in the housing of the assembly 10.

The folding of the flexible substrate 11 to create the folded subassembly 26, in addition to providing a compact packaging factor for substrate assembly 10, also relates to a major aspect of the present invention whereby an advantageous direct conductor connection is provided between conductors at the end portions 12A and 13A of the flexible substrate 11. This is accomplished in the following manner.

A first integral projection 27 of the flexible substrate 11 is provided which is separate from the interim substrate portion 14. The projection 27 includes, on one side as shown in FIG. 1, a conductor 28 intended for conducting a power supply B+ signal. A second conductor 29, preferably on an opposite (under) side of the projection 27, is also provided and corresponds to a circuit ground connection. The projection 27 has a proximal end 30 of the projection essentially integral with the first substrate portion 12, actually an integral extension 38 of portion 12, and adjacent end portion 12A. The projection 27 extends from proximal end 30 to a free distal end 31 of the projection. In addition, a second projection 32 of the flexible substrate 11 is provided which has corresponding power supply B+ and ground conductors 32A and 32B thereon for providing mating electrical connections to the conductors 28 and 29 on the first projection 27. The second projection 32 has a proximal end 33 integral with the second substrate portion 13 and adjacent end portion 13A. The projection 32 extends from proximal end 33 to a free distal end 34 of the second projection 32. The projection conductors 28 and 29 are directly electrically connected at the proximal end 30 to conductors 15A and 15B, respectively, which are located at end portion 12A and comprise some of the plurality of conductors 15. The projection conductors 32A and 32B are directly electrically connected at the proximal end 33 to conductors 16A and 16B, respectively, which are located at end portion 13A and comprise some of the plurality of conductors 16.

As shown in FIG. 2, after folding of the flexible substrate 11 and creation of the subassembly 26, the distal ends 31 and 34 of the first and second projections 27 and 32 are disposed adjacent to one another. It should be noted that in order to show this in FIG. 2, a portion of rigidizer plate 24 is shown removed along with a portion of a top metal plate cover. Then, a pair of electrical solder connections 35 are provided directly electrically connecting, with a short circuit connection, the power supply B+ conductors 28 and 32A and the ground conductors 29 and 32B, respectively. The solder connections 35 essentially comprise an electrical connection means, separate from any conductors on the first and interim substrate portions, which provide, at the distal ends 31 and 34, a desired direct electrical short circuit connection between conductors 15A, 16A, and 15B and 16B at the end portions 12A and 13A of the first and second portions of the flexible substrate, respectively. This direct connection is accomplished without the use of conductors which travel over the interim portion 14 of the flexible substrate 11. It should be noted that the width of the conductors 28 and 29 and 32A and 32B, as measured across the projections 27 and 32, are preferably substantially wider than the width of the conductors comprising the first, second and third pluralities of conductors 15, 16 and 21, as measured parallel to the plane of substrate portions 12, 13 and 14, respectively.

An advantage of the above noted structure is that now a low resistance short-distance path is provided for the high current carrying B+ and ground connections between the first and second substrate portions 12 and 13. By providing a short-distance electrical connection, the effects of RF interference and noise may be minimized, and by providing a low-resistance path, the effect of series voltage drop between power supply and ground potentials at 12A and 13A is minimized. This is achieved without using conductors on the interim substrate portion 14, and this allows for a more efficient conductor layout for substrate 11.

In providing the solder connection between the distal ends 31 and 34, two holes 36 are provided in the distal end 31 and a mating two holes 37 are provided in the distal end 34. Preferably, these holes comprise plated-through holes in the flexible substrate with each hole associated with one of the conductors 28, 29, 32A or 32B. Conductor areas around the holes 36 and 37 are exposed to facilitate providing the electrical solder connections 35 between the conductors on the distal ends of the projections. While preferably the electrical connections 35 are solder, any other type of suitable electrical connection means, such as conductive epoxy, rivets or even welding or brazing, can comprise the structure (means) for providing the desired electrical connection between the conductors at the distal ends of the projections. What is significant is that now a low resistance direct short distance path, separate from the conductors on the interim portion 14 and first substrate portion 12, has now been provided between conductors 15A, 16A, and 15B and 16B at the end portions 12A and 13A of the first and second substrate portions.

In providing an external connection to the flexible substrate assembly 10 of the present invention, a molded plastic connector 40 is utilized having individual connector pins 41 embedded therein. At least one of the pins 41 corresponds to a power supply B+ pin 42 and another corresponds to a ground potential pin 43. The connector pins 41 mate with holes 39 in an integral extension 38 of the first substrate portion 12. Areas of conductors 15A and 15B adjacent to these holes are exposed to permit solder connection between the pins and these conductors. Some of these holes may comprise plated-through holes in which a connection is provided between conductors associated with the top side 11A of the flexible substrate and conductors associated with the bottom side 11B of the flexible substrate 11. The B+ and ground pins 42 and 43 mate with holes 39A and 39B and provide, via solder and conductors 15A and 15B, electrical connection between the pins 42 and 43 and the B+ and ground conductors 28 and 29, respectively. In this manner, the connector 40 allows the efficient and low resistance application of B+ and ground voltage potentials to the flexible substrate electronic assembly 10 of the present invention.

After the flexible substrate subassembly 26 shown in FIG. 1 has been folded along the fold lines A through G to provide the folded subassembly 26 shown in FIG. 2, then this folded subassembly is mounted within a protective housing 44 of the flexible substrate electronic assembly 10. The housing 44 is primarily molded plastic in structure and has plastic side walls 45 which have formed therein alignment and support-mounting ledges 46. These ledges 46 provide alignment and support for the rigidizer plates 23 and 25, which, as previously noted, are bonded together to form the folded subassembly as shown in FIG. 2. The connector 40, which is also preferably a molded plastic part having the connector pins 41 embedded therein, has an outer groove portion 47 which effectively slidingly mates with, on three sides, edges 48 of the housing 44. The housing side walls 45, the connector 40, and a substantially planar external metal cover plate 49 essentially form a substantially closed housing cavity 50 in which the folded assembly 26 shown in FIG. 2 is mounted.

Preferably, the rigidizer plate 24 is a thermally conductive metal plate which is thermally conductively bonded to the external metal cover 49. The rigidizer plate 24 has a planar bottom surface 24A planarly bonded to and oriented parallel with respect to an inner planar surface 49A of the cover 49. More specifically, coplanar central and peripheral portions 24C and 24D (See FIG. 2.) of the bottom surface 24A are planarly thermally bonded to surface 49A. Preferably, all of the high power dissipation components, such as power transistors 19A, which are included in the electronic assembly 10 are associated with the second substrate portion 13 and are directly mounted to the thermally conductive rigidizer plate 24. The leads of the transistors 19A are connected to the conductors 16 on substrate portion 13. Since the rigidizer plate 24 is mounted to the external metal cover plate 49, this provides optimum heat sinking for these components by providing a direct thermally conductive path between these components and an external surface of the housing 44 comprising a top surface 49B of the metal cover 49. This is accomplished while providing an improved packaging factor for the assembly 10 since the other rigidizer plates 23 and 25 only have their peripheral edges supported by and coupled to the housing 44 via the ledges 46.

An additional aspect of the flexible substrate electronic assembly 10 is that an integral extension 51 of the second substrate portion 13 is provided, the extension 51 having a plurality of conductors 52 carried thereon. A distal end portion 53 of the extension 51 passes through a slot 54 in a bottom wall 55 of the housing 44 and extends into a lower housing cavity 56 separate from the housing cavity 50 shown in FIG. 2. Preferably, providing the extension 51 allows the use of a portion of the flexible substrate 11 to provide electrical connection to components mounted in this lower cavity 56 wherein it is desirable to environmentally isolate the components in the closed cavity 50 from the components in the cavity 56. It is contemplated that solenoids will be provided in the cavity 56 and that environmental isolation between these electromechanical devices and the electronic drive circuitry in the cavity 50 is desired. This isolation is provided by the walls and cover plate 49 of the housing 44 and by providing any type of suitable sealing material adjacent the slot 54 after assembly of the subassembly 26 into the housing 44.

While we have shown and described specific embodiments of this invention, further modifications and improvements will occur to those in the art. All such modifications, such as substitution of a different type of electrical connection means for the solder connections disclosed herein, which retain the basic underlying principles disclosed and claimed herein are within the scope of this invention.

We claim:

1. A flexible substrate electronic assembly comprising:
    a flexible insulating substrate having integral first and second substantially planar portions oriented in different planes, said flexible substrate having an integral interim portion extending between and having end portions integral with said first and second substrate portions;
    first and second pluralities of conductors carried by said first and second substrate portions, respectively, and an interim plurality of conductors carried by said interim substrate portion and providing electrical connections to conductors carried by said first and second substrate portions;
    first and second pluralities of electronic components mounted on said first and second substrate portions and electrically connected to conductors carried by said first and second substrate portions, respectively;

wherein the improvement comprises:
    at least one integral first projection of said flexible substrate, separate from said interim substrate portion, carrying at least one conductor and extending in a direction noncoplanar with respect to said planar first and second substrate portions from a proximal end of said first projection integral with said first substrate portion to a free distal end of said first projection, said at least one conductor electrically connected at said proximal end to at least one conductor carried by said first substrate portion at a first end portion thereof and extending to said distal end of said first projection; and
    electrical connection means, separate from any conductors carried by said first and interim substrate portions, for connecting, at said distal end of said first projection, said at least one conductor carried by said first projection to a conductor carried by said second substrate portion at a second end portion thereof, said electrical connection means and said first projection forming an electrical connection between said first and second planar substrate portions.

2. An electronic assembly according to claim 1 wherein said distal end of said first projection is positioned adjacent said second substrate portion with said one conductor on said first projection directly soldered to and in contact with said conductor carried by said second substrate portion.

3. An electronic assembly according to claim 1 which includes first and second rigidizer plates on which said first and second substrate portions are carried, said interim portion forming a flexible electrical connection, via said plurality of interim conductors, between said first and second substrate portions.

4. An electronic assembly according to claim 3 wherein said first and second pluralities of components are each mounted on a top side of said first and second substrate portions, respectively, resulting in first and second top-side component subassemblies associated with each of said first and second substrate portions, respectively.

5. An electronic assembly according to claim 4 wherein each of said first and second substrate portions are substantially planar in orientation but are disposed in different parallel planes.

6. An electronic assembly according to claim 5 wherein said interim portion includes a third substrate portion having a third plurality of conductors carried thereby with a third plurality of electrical components mounted thereon, said third substrate portion being carried by its own associated third ridigizer plate.

7. An electronic assembly according to claim 6 wherein each of said first, second and third substrate portions are substantially planar in orientation and are each disposed in different parallel planes.

8. An electronic assembly according to claim 1 which includes a second integral projection, separate from said interim substrate portion, extending from a proximal end of said second projection integral with said second substrate portion to a free distal end of said second projection, said distal ends of said first and second projections disposed adjacent to one another.

9. An electronic assembly according to claim 8 wherein said electrical connection means comprises at least one solder joint positioned between and in contact with conductors on said distal ends of said first and second projections.

10. An electronic assembly according to claim 1 wherein said first projection includes at least two conductors disposed at least at said distal end thereof, said electrical connection means providing electrical connections, at said distal end of said first projection, between said two conductors and two mating conductors, respectively, carried by said second substrate portion at said second end portion thereof, said two conductors on said first projection and said electrical connection means providing electrical connections between two conductors carried by said first substrate portion at said first end portion thereof and said two conductors carried by said second substrate portion at said second end portion thereof.

11. An electronic assembly according to claim 10 wherein said at least two conductors comprise power supply ground and DC potential connections which provide low resistance power interconnections between said first and second substrate portions.

12. An electronic assembly according to claim 1 wherein said one conductor on said first projection corresponds to a low resistance power supply conductor having a width across said first projection which is wider than the width of said first and second pluralities of conductors on said first and second substrate portions as measured parallel to the planes thereof for providing power supply current to at least one of said first and second substrate portions.

13. An electronic assembly according to claim 1 which includes an electrical connector with contact pins therein and an integral extension of one of said first and second substrate portions, said extension having conductors thereon for mating with and providing electrical connection to said electrical connector pins.

14. An electronic assembly according to claim 13 wherein at least one of said electrical connector pins corresponds to a power supply voltage pin and wherein said at least one conductor carried by said first projection is directly electrically connected to said power supply pin.

15. An electronic assembly according to claim 1 wherein said electrical connection means provides a direct short circuit connection between said conductor carried by said first projection at said distal end and said conductor carried by said second substrate portion at said second end portion thereof.

16. A flexible substrate electronic assembly comprising:
    a flexible insulating substrate having integral first and second portions, said flexible substrate having an integral interim portion extending between and having end portions integral with said first and second substrate portions;
    first and second pluralities of conductors carried by said first and second substrate portions, respectively, and an interim plurality of conductors carried by said interim substrate portion and providing electrical connections to conductors carried by said first and second substrate portions;
    first and second pluralities of electronic components mounted on said first and second substrate portions and electrically connected to conductors carried by said first and second substrate portions, respectively;
    first and second separate rigidizer plates each having planar top surfaces on which said first and second substrate portions are mounted, said interim substrate portion and said interim conductors forming a flexible electrical connection between said first and second pluralities of components; and
    a housing for said assembly in which said first and second substrate portions are disposed in a first cavity formed within said housing, said first and second substrate portions each being substantially planar in orientation but oriented in different planes;
    wherein the improvement comprises said first rigidizer plate being thermally conductive and being thermally planarly coupled, at coplanar central and peripheral portions of a bottom surface of said housing, said second rigidizer plate mounted within said housing, and
    wherein walls of said housing define a second cavity, in which solenoids will be provided, separate and environmentally isolated from said first cavity, and
    electrical connection means extending between said first and second cavities and connecting electronic drive circuitry in said first cavity to said second cavity.

17. An electronic assembly according to claim 16 which includes an external metal cover plate forming part of said first cavity of said housing, said thermally conductive first rigidizer plate being thermally bonded to said cover plate.

18. An electronic assembly according to claim 16 wherein said thermally conductive first rigidizer plate, at central and peripheral portions thereof, is planarly bonded to and oriented parallel with respect to a planar surface of said cover plate.

19. An electronic assembly according to claim 18 wherein interior walls of said housing include mounting ledges for providing alignment and support for said second rigidizer plate.

20. An electronic assembly according to claim 16, wherein said electrical connection means comprises an extension of said flexible substrate extending between said first and second cavities through a slot in a wall in said housing separating said first and second cavities.

21. A substrate electronic assembly comprising:
    an insulating substrate;
    a plurality of conductors carried by said substrate;
    a plurality of electronic components mounted on said substrate and electrically connected to said conductors carried by said substrate;
    a housing for said assembly in which said substrate is disposed in a first cavity formed within and by walls of said housing;
    wherein walls of said housing also define a second solenoid housing cavity, in which solenoids will be provided, separate and environmentally isolated from said first cavity, and
    electrical connection means extending between said first and second cavities and connecting electronic drive circuitry, comprising said plurality of electronic components, in said first cavity to said second cavity.

22. A substrate electronic assembly according to claim 21 wherein said insulating substrate comprises a flexible substrate which is mounted on a rigidizer plate provided in said first cavity.

23. A substrate electronic assembly according to claim 22 wherein said rigidizer plate is thermally conductive and is thermally planarly coupled, at coplanar central and peripheral portions, to a thermally conductive surface of said housing.

24. A substrate electronic assembly according to claim 23 which includes an external metal cover plate forming part of said first cavity of said housing, said thermally conductive rigidizer plate being thermally bonded to said cover plate.

25. A substrate electronic assembly according to claim 23 wherein said electrical connection means comprises an extension of said flexible substrate extending between said first and second cavities through a slot in a wall in said housing separating said first and second cavities.

26. A substrate electronic assembly according to claim 21 wherein said electrical connection means comprises an extension of said flexible substrate extending between said first and second cavities through a slot in a wall in said housing separating said first and second cavities.

27. A substrate electronic assembly according to claim 21 wherein said insulating substrate comprises a flexible substrate which is thermally coupled to a thermally conductive surface of said housing.

28. A substrate electronic assembly according to claim 27 which includes an external metal cover plate forming part of said first cavity of said housing, said insulating substrate being mounted to said cover plate.

* * * * *

UNITED STATES PATENT AND TRADEMARK OFFICE
CERTIFICATE OF CORRECTION

PATENT NO. : 5,276,418
DATED : 1/4/94
INVENTOR(S) : Klosowiak et al.

It is certified that error appears in the above-identified patent and that said Letters Patent is hereby corrected as shown below:

In claim 16 Col. 10, line 12 insert after "surface", -- of said first rigidizer plate, to a thermally conductive surface--

In claim 18. col 10. line 28, "16" should be -- 17--.

Signed and Sealed this

Thirtieth Day of August, 1994

*Attest:*

BRUCE LEHMAN

*Attesting Officer*  *Commissioner of Patents and Trademarks*